United States Patent
Liu

(10) Patent No.: US 7,696,066 B2
(45) Date of Patent: Apr. 13, 2010

(54) METHOD OF FABRICATING INTERGRATED CIRCUIT CHIP

(75) Inventor: Yan-Hsiu Liu, Tainan (TW)

(73) Assignee: United Microelectronics Corp., Hsin-Chu (TW)

( * ) Notice: Subject to any disclaimer, the term of this patent is extended or adjusted under 35 U.S.C. 154(b) by 129 days.

(21) Appl. No.: 12/126,939

(22) Filed: May 26, 2008

(65) Prior Publication Data

US 2008/0233737 A1    Sep. 25, 2008

Related U.S. Application Data

(62) Division of application No. 11/555,695, filed on Nov. 2, 2006.

(51) Int. Cl.
*H01L 21/46* (2006.01)
(52) U.S. Cl. .................. 438/458; 438/462; 257/620
(58) Field of Classification Search .............. 438/113, 438/458, 462; 257/620, E23.194
See application file for complete search history.

(56) References Cited

U.S. PATENT DOCUMENTS

| 2003/0080422 A1* | 5/2003 | Ohara ................ 257/738 |
| 2003/0122220 A1 | 7/2003 | West |
| 2004/0217840 A1 | 11/2004 | Lee |

* cited by examiner

*Primary Examiner*—Theresa T Doan
(74) *Attorney, Agent, or Firm*—Winston Hsu

(57) ABSTRACT

A method of manufacturing an integrated circuit (IC) chip is provided. The method includes the following steps. First, a substrate is provided. The substrate is divided into an internal region and an external region by a die seal ring region. A number of circuit units are then formed in the internal region on the substrate. Thereafter, a dielectric layer is formed over the substrate, interconnects are formed in the dielectric layer within the internal region, and a number of bonding pad structures are formed in the dielectric layer within the external region. Finally, a cutting process is performed along a number of scribed lines on the substrate to form a number of chips. The bonding pad structures are exposed at the sides of each chip.

6 Claims, 8 Drawing Sheets

METHOD OF FABRICATING INTERGRATED CIRCUIT CHIP

CROSS-REFERENCE TO RELATED APPLICATION

This application is a divisional of an application Ser. No. 11/555,695, filed on Nov. 2, 2006, now pending. The entirety of the above-mentioned patent applications is hereby incorporated by reference herein and made a part of this specification.

BACKGROUND OF THE INVENTION

1. Field of the Invention

The present invention relates to an integrated circuit (IC) device, chip, and method of fabricating the same; in particularly to an integrated circuit device and an IC chip with bonding pad structures at side, and method of fabricating the same.

2. Description of Related Art

Bonding pads are essential elements of bonding the integrated circuit (IC) chips with package substrates. The conventional bonding pads are formed on a front surface of the substrate. In general, the bonding pads are formed while the upmost metal layer of interconnects are formed. In addition, after the bonding pads are formed and before the packaging process is performed, the substrate will be covered by a passivation layer so as to resist the moisture. Accordingly, the passivation layer will be removed afterwards to form bonding pad openings, and the bonding pads are then exposed.

However, since the conventional bonding pads are formed in an region within a die seal ring region on the front surface of the substrate and occupy a larger space, so that the package structure is oversized. The trend of pursuing slightness, thinness, shortness, and small volume is not then followed.

On the other hand, given that the bonding pad openings are formed, and other elements, for example, color filters and micro lenses of a CMOS image sensor (CIS) are then constructed on the substrate, the bonding pads will be corroded by a developer and result in the formation of pittings during the process of constructing the elements, so that the function of the bonding pads is affected. Furthermore, the formation of the bonding pad openings may also bring about an uneven coating of a photoresist layer in the successive process of patterning filters, impairing the optical characteristics.

SUMMARY OF THE INVENTION

The present invention is to provide an IC chip, an IC device and the method of fabricating the same, which reduces the area occupied by bonding pads and the size of a package structure.

The present invention is also to provide an IC chip, an IC device and the method of fabricating the same, which avoids the formation of pittings due to the fact that the bonding pads are exposed in a developer.

The present invention is still to provide an IC chip, an IC device and the method of fabricating the same, which avoids the occurrence of optical problems arisen from the formation of the bonding pad openings which gives rise to an uneven coating of a photoresist in the successive process.

The present invention provides an IC chip, which comprises a substrate, a plurality of circuit units and a plurality of interconnects disposed on a front surface of the substrate, and a plurality of bonding pads disposed at the sides of the substrate, wherein each bonding pad includes a plurality of conductive layers.

According to one embodiment of the present invention, said bonding pad further includes a plurality of connecting portions which connects the adjoining conductive layers. The connecting portions are, for example, shaped as cylinders or layers.

According to one embodiment of the present invention, said connecting portions are cylindrically shaped and arranged in an irregular or a regular way. The regular arrangement includes an alternate arrangement, a line-up arrangement, or a matrix arrangement.

According to one embodiment of the present invention, said connecting portions are shaped as layers and are smaller than or equal to the adjoining conductive layers.

According to one embodiment of the present invention, said connecting portions are equally or unequally sized.

The present invention further provides an IC device, which comprises a substrate divided into an internal region and an external region by a die seal ring region. On the substrate, there are a plurality of circuit units, a dielectric layer, a first conductive layer, a second conductive layer, and a plurality of vias/connecting portions. The dielectric layer covers the circuit units. The first conductive layer and the second conductive layer are disposed in the dielectric layer and are connected to each other through the vias/connecting portions. Parts of the first and the second conductive layers and the vias/connecting portions are disposed in the internal region and constitute interconnects, while parts of the first and the second conductive layers and the vias/connecting portions are disposed in the external region and constitute a plurality of bonding pad structures.

According to embodiment of the present invention, the first and the second conductive layers of each bonding pad structure extend from edge of the die seal ring region to a scribed line region on the substrate.

According to one embodiment of the present invention, the vias/connecting portions of each bonding pad are arranged in an irregular or a regular way. The regular arrangement includes an alternate arrangement, a line-up arrangement, or a matrix arrangement.

According to one embodiment of the present invention, the vias/connecting portions of each bonding pad are equally or unequally sized.

According to one embodiment of the present invention, the vias/connecting portions of each bonding pad and the vias/connecting portions of the interconnects are equally or unequally sized.

The present invention further provides a method of manufacturing an IC chip. First, a substrate is provided. The substrate is divided into an internal region and an external region by a die seal ring region. Then, a plurality of circuit units is formed in the internal region on the substrate. Thereafter, a dielectric layer is formed over the substrate, a plurality of interconnect is formed in the dielectric layer within the internal region, and a plurality of first bonding pad structures is formed in the dielectric layer within the external region. Finally, a cutting process is performed along a plurality of scribed lines on the substrate to form a plurality of chips. The first bonding pad structures are then exposed at the sides of each chip.

According to one embodiment of the present invention, the method of forming said interconnects and the first bonding pad structures includes the following steps: forming a plurality of conductive layers in the dielectric layer within the internal and the external regions, and forming a plurality of vias/connecting portions electrically coupled with the conductive layers in the dielectric layer within the internal and the external regions. The conductive layers and the vias/connecting portions within the internal region constitute the interconnects, while the conductive layers and the vias/connecting portions within the external region constitute the first bonding pad structures.

According to the embodiments of the present invention, the method of forming the dielectric layer, the interconnects, and the first bonding pad structures as stated above includes the steps of firstly forming the dielectric layer on the substrate. Then, a plurality of trenches and a plurality of via openings/openings are formed in the dielectric layer. Finally, a conductive material is filled into the trenches and the via openings/openings to form the conductive layers and the vias/connecting portions.

According to one embodiment of the present invention, the method of forming the interconnects and the first bonding pad structures as stated above includes the steps of first forming a first part of the dielectric layer on the substrate, and forming the conductive layers on the first part of the dielectric layer afterwards. Thereafter, a second part of the dielectric layer is formed on the substrate, and a plurality of via openings/openings is formed therein, so as to expose parts of the conductive layers. Finally, a plurality of conductive plugs is formed in the via openings/openings so as to constitute the vias/connecting portions.

According to one embodiment of the present invention, said first bonding pad structures extend from edge of the die seal ring region to the scribed lines on the substrate.

According to one embodiment of the present invention, the method of forming said IC chips further includes the steps of forming a plurality of second bonding pad structures in the internal region before performing the cutting process along the scribe lines on the substrate.

The bonding pad structures of the present invention are positioned at the sides of the chips, which can substantially reduce the area occupied by the package structure and permit further miniaturization of the products.

The bonding pad structures of the present invention are exposed during the cutting process. Hence, neither are the bonding pads likely to be corroded by a developer and result in the formation of pittings, nor do the optical problems arisen from the formation of the bonding pad openings which gives rise to an uneven coating of a photoresist in the successive process occur.

In order to the make aforementioned and other objects, features and advantages of the present invention comprehensible, a preferred embodiment accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
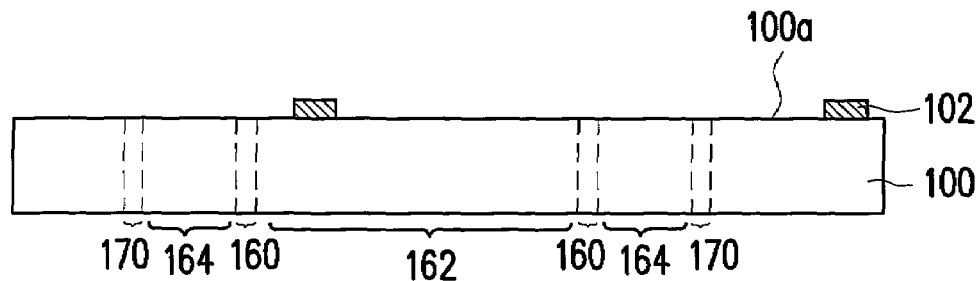
FIGS. 1A to 1C are cross-sectional views illustrating the steps of fabricating an IC chip with bonding pad structures at the sides according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
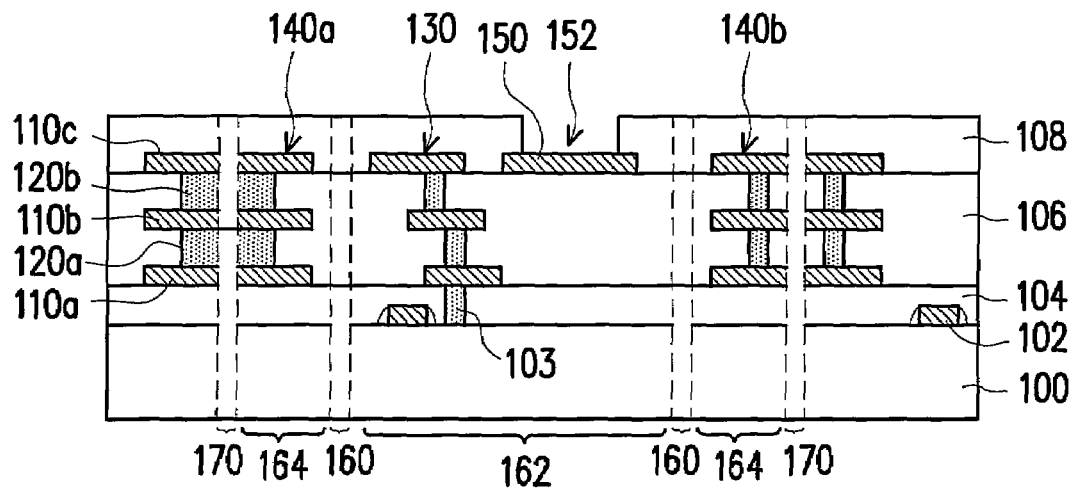
Figure 1C:
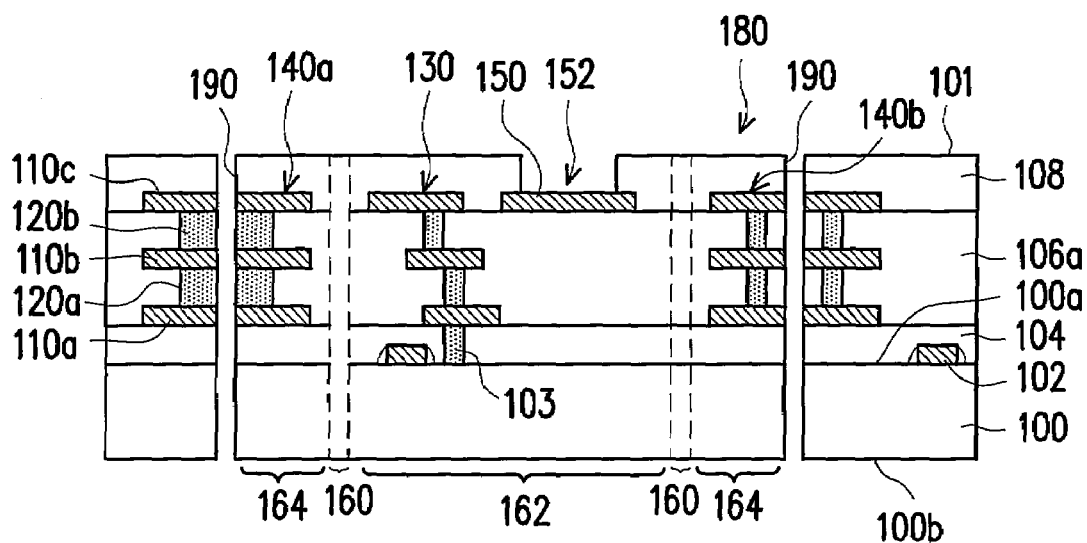

FIGS. 1A to 1C are cross-sectional views illustrating the steps of fabricating an IC chip with bonding pad structures at the sides according to one embodiment of the present invention.

Referring to FIG. 1A, a substrate 100 is provided. The substrate 100 is, for example, a semiconductor substrate made of monocrystalline silicon or the like, a compound substrate made of silicon germanium or the like, or a silicon substrate on an insulating layer (SOI). The substrate 100 includes a die seal ring region 160 and a scribed region 170. The region inside the die seal ring region 160 is defined as an internal region 162, while the region outside the die seal ring region 160 is defined as an external region 164. First, a plurality of circuit units 102 is formed in the internal region 162 on a front surface 100a of the substrate 100. The circuit units 102 are, for example, dynamic random access memory (DRAM) devices, static random access memory (SRAM) devices, read only memory (ROM) devices, gate arrays, and the like.

Thereafter, referring to FIG. 1B, a dielectric layer 104 is formed on the front surface 100a of the substrate 100, and a contact 103 electrically coupled with the circuit units 102 is formed therein. After that, a dielectric layer 106 is formed over the substrate 100. The dielectric layers 104 and 106 are, for example, made of silicon oxide or low dielectric constant material with a dielectric constant lower than 4. The dielectric layers 104 and 106 may comprise other material layers, for example, liner layers, etching stop layers, or anti-reflective layers, which are generally called dielectric layers. While the dielectric layer 106 is being formed, conductive layers 110a, 110b, 110c and vias/connecting portions 120a, 120b are simultaneously formed in the dielectric layer 106 within the internal region 162 and the external region 164. The conductive layers described above are also called metal layers. The conductive layers 110a, 110b, 110c and the vias/connecting portions 120a, 120b in the dielectric layer 106 within the internal region 162 are utilized as interconnects 130, while the conductive layers 110a, 110b, 110c and the vias/connecting portions 120a, 120b in the dielectric layer 106 within the external region 164 are employed as bonding pad structures 140a and 140b.

In one embodiment, the bonding pad structures 140a and 140b extend from the die seal ring region 160 to the scribed line region 170. The vias/connecting portions 120a and 120b in the bonding pad structure 140a are equally or unequally sized and shaped. In addition, the vias/connecting portions 120a, 120b in the bonding pad structure 140b and the same in the bonding pad structure 140a are equally or unequally sized and shaped. The material of the conductive layers 110a, 110b, 110c and the vias/connecting portions 120a, 120b is, for example, tungsten, copper, and an alloy thereof.

Then, a passivation layer 108 is formed on the substrate 100. The passivation layer 108 is, for example, a silicon oxide layer, a silicon nitride layer, and the combination thereof, and the method of forming the passivation layer 108 includes, for example, the CVD process.

Thereafter, referring to FIG. 1C, a cutting process is performed along a plurality of scribed lines 170 on the substrate 100. For example, the cutting process is performed from the upper surface 101 on the front surface 100a of the substrate 100 to the back surface 100b of the substrate 100, or, from the back surface 100b of the substrate 100 to the upper surface 101 on the front surface 100a of the substrate 100, so as to form a plurality of chips 180. The bonding pad structures 140a and 140b at the sides 190 of each chip 180 are then exposed. The schematic view of the chip 180 is shown in FIG. 2A.

Figure 2A:
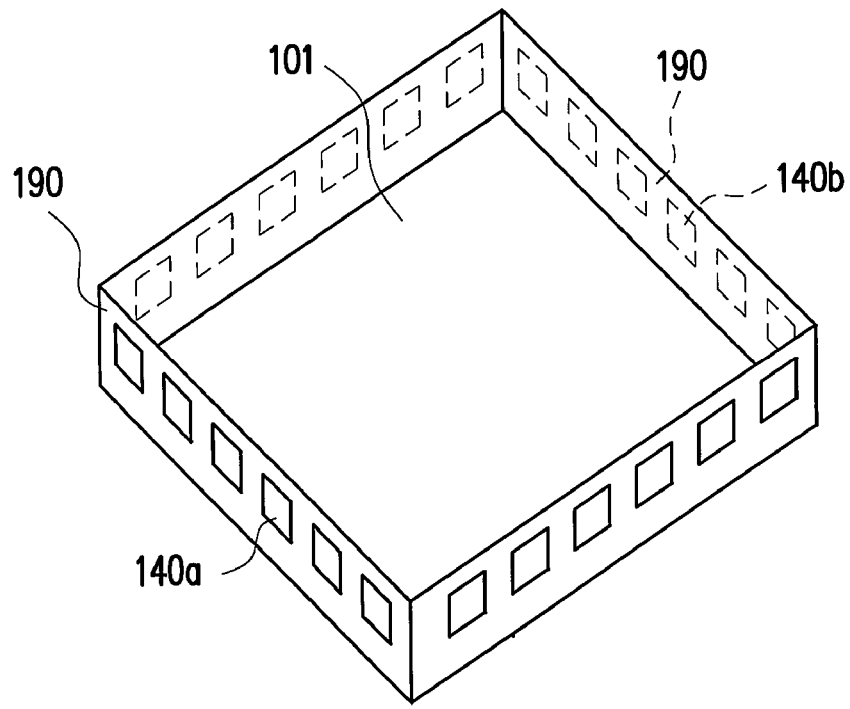
FIG. 2A is a schematic view illustrating an IC chip with a bonding pad structure at the sides according to one embodiment of the present invention.

Referring to FIG. 2A, the bonding pad structures 140a and 140b disclosed in the embodiment of the present invention are simultaneously formed together with the formation of the interconnects. The substrate is cut to form the chips 180, resulting in the exposure of the bonding pad structures 140a and 140b in the external region. Namely, the bonding pad structures 140a and 140b disclosed in the embodiment of the present invention are formed outside the die seal ring region of the chips 180, i.e. the sides 190 of the chips 180. Differing from the present invention, the conventional bonding pad structures are formed inside the die seal ring region on the front surface of the substrate.

In order to further increase the bonding pads, other bonding pads can be formed in the internal region within the die seal ring region on the front surface 100a of the substrate based on the prior art. Referring to FIG. 1B, as stated above, while the interconnects 130 and the upmost conductive layer 110 of the bonding pad structures 140a and 140b are formed, a bonding pad 150 can be simultaneously fabricated in the internal region 162. The bonding pad opening 152 is then formed after the formation of the passivation layer 108, so that the bonding pad 150 is exposed. The schematic view of the chip 180 is shown in FIG. 2B.

Figure 2B:
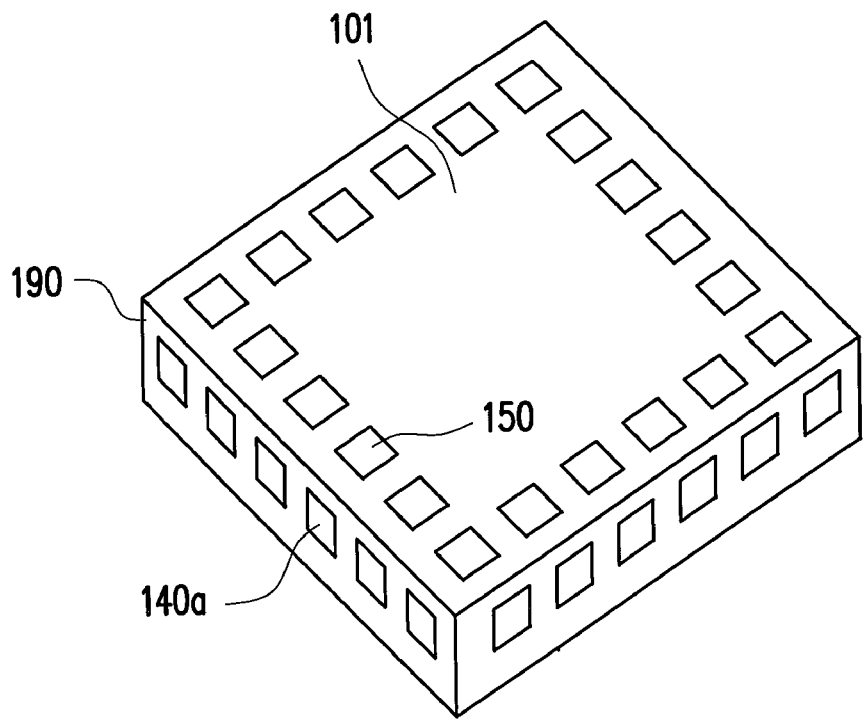
FIG. 2B is a schematic view illustrating an IC chip with a bonding pad structure at the sides and in the front surface according to one embodiment of the present invention.

Referring to FIG. 2B, the bonding pad structures 150 and 140a can be simultaneously disposed on the upper surface 101 on the front surface and the sides 190 of the chip 180, so as to increase the bonding pads of a chip, respectively.

Figure 3A:
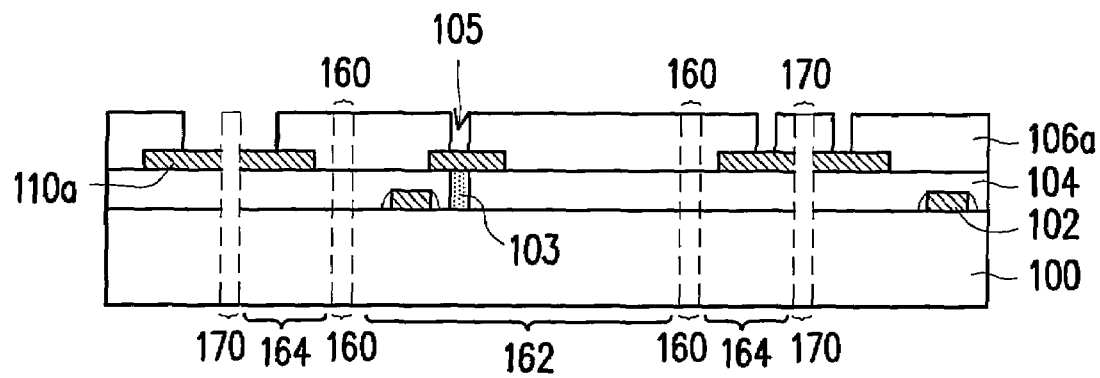
FIGS. 3A to 3C are cross-sectional views illustrating the steps of fabricating an IC chip with bonding pad structures at the sides according to one embodiment of the present invention.
Figure 3B:
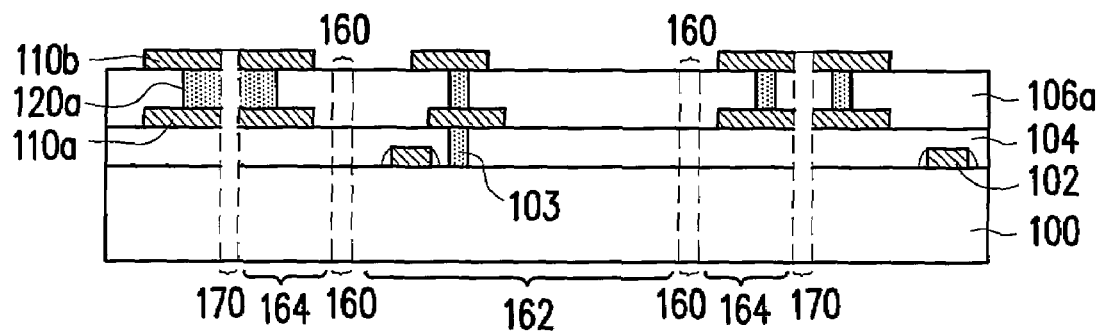
Figure 3C:
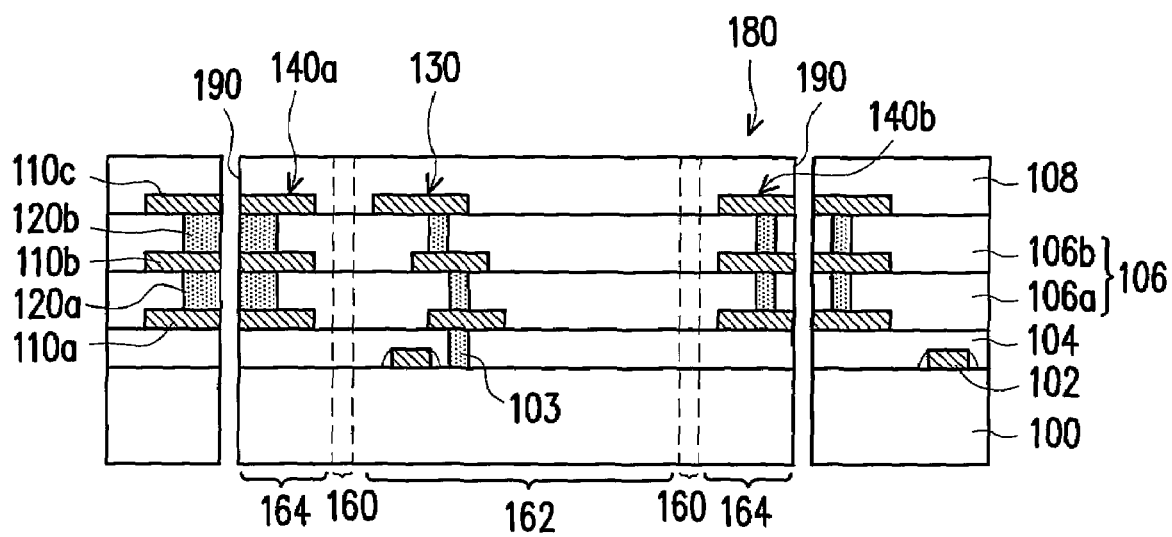
Figure 4A:
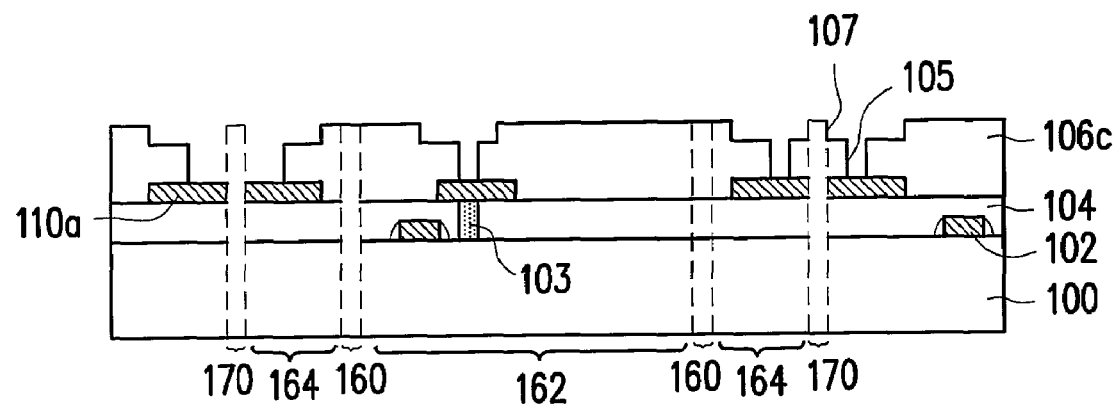
FIGS. 4A to 4B are cross-sectional views illustrating the steps of fabricating an IC chip with bonding pad structures at the sides according to one embodiment of the present invention.
Figure 4B:
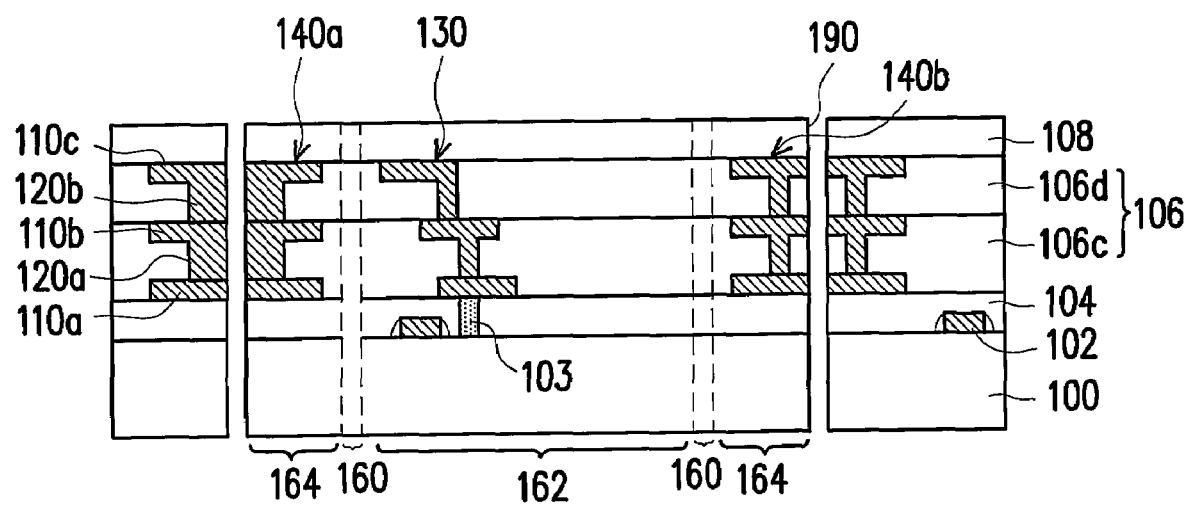

The method of manufacturing said bonding pad structures 140a, 140b and the interconnects 130 can be a conventional process, as shown in FIGS. 3A to 3C. Dual damascene techniques can also be applied, as shown in FIGS. 4A to 4B. Or, the above-mentioned methods are both adopted at the same time. Details are illustrated below.

Referring to FIG. 3A, first, the circuit units 102, the dielectric layer 104, and the contact 103 are formed on the substrate 100. Then, the conductive layer 110a is constructed on the substrate 100. The method of fabricating the conductive layer 110a includes the following steps: firstly forming a metal material layer over the substrate 100 through a chemical deposition process, and then patterning the metal material layer through a photolithography and etching process. Next, a first part 106a of the dielectric layer 106 is formed over the substrate 100. After that, via openings/openings 105 are constructed in the dielectric layer 106a through the photolithography and etching process.

Next, referring to FIG. 3B, metal plugs are formed in the via openings/openings 105, giving rise to the formation of the vias/connecting portions 120a. Then, a conductive layer 100b is formed on the dielectric layer 106a.

Afterwards, referring to FIG. 3C, a second part 106b of the dielectric layer 106, the vias/connecting portions 120b, and the conductive layer 110c are formed according to the aforesaid method, so that the fabrication of the bonding pad structures 140a, 140b and the interconnects 130 are completed.

Referring to FIG. 4A, first, the IC units 102, the dielectric layer 104, and the contact 103 are formed on the substrate 100. Then, the conductive layer 110a is constructed on the substrate 100. The method of fabricating the conductive layer 110a includes the following steps: firstly forming a metal material layer on the substrate 100 through a chemical deposition process, and then patterning the metal material layer through a photolithography and etching process. Next, a first part 106c of the dielectric layer 106 is formed over the substrate 100. Next, trenches 107 and the via openings/openings 105 are constructed in the dielectric layer 106c through the photolithography and etching process.

Afterwards, referring to FIG. 4B, a conductive material is filled into the trenches 107 and the via openings/openings 105. For example, the conductive material (not shown) can be formed on the substrate 100 through the chemical vapor deposition process, so as to cover the dielectric layer 106c and to fill the trenches 107 and the via openings/openings 105. Then, unnecessary conductive material is removed through a chemical mechanical polishing process or an etching back process. The conductive material left in the trenches 107 is used as the conductive layer 110b, while that left in the via openings/openings 105 is employed as the vias/connecting portions 120a. Afterwards, the second part 106d of the dielectric layer 106, the vias/connecting portions 120b, and the conductive layer 110c are formed according to the aforesaid method, so that the fabrication of the bonding pad structures 140a, 140b and the interconnects 130 is completed.

In the aforesaid fabricating method, after the formation of the bonding pad structures 140a, 140b and the interconnects 130 is completed, other devices can further be formed on the passivation layer 108 based on actual demands before performing the cutting process. When the method is applied to fabricating a complementary metal-oxide-semiconductor (CMOS) image sensor, for example but not limited to, the bonding pad structures 140a, 140b and the interconnects 130 are manufactured first. Color filters and micro lenses (not shown) are then formed. Next, the cutting process is performed. Since the bonding pad structures 140a and 140b at the sides are exposed after the color filters and the micro lenses are formed, the structures will not be damaged by a developer or an etching solution.

Each part of the bonding pad structure of the present invention can be optionally sized and shaped based on actual demands. Several examples are listed below for further illustration. However, the present invention is not limited to these examples. FIGS. 5A to 5K are schematic cross-sectional views illustrating several bonding pad structures according to one embodiment of the present invention.

Figure 5A:
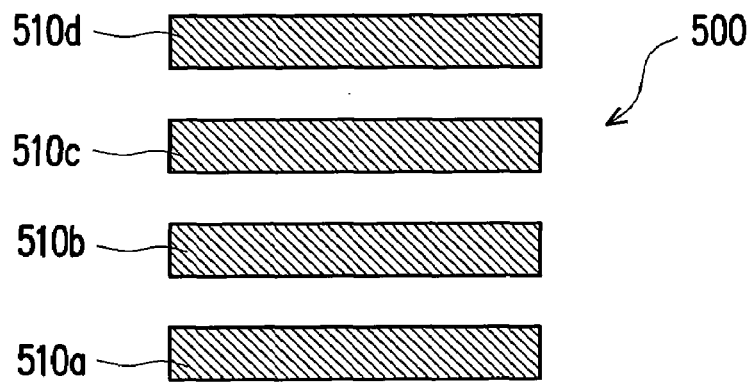
FIGS. 5A to 5K are schematic cross-sectional views illustrating several bonding pad structures according to one embodiment of the present invention.
Figure 5B:
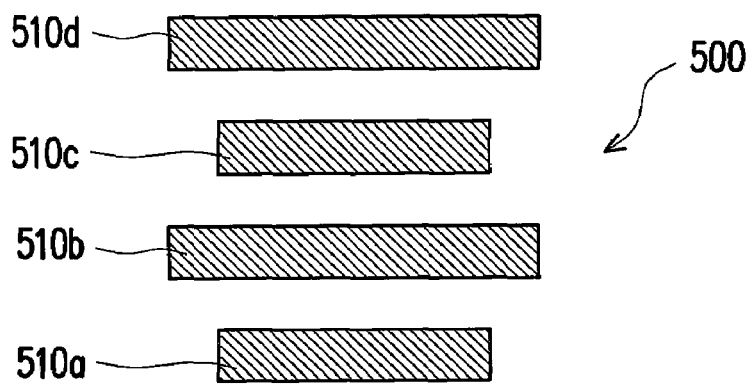

Referring to FIGS. 5A and 5B, the bonding pad structure 500 of the present invention includes several conductive layers 510a, 510b, 510c, and 510d. The conductive layers 510a, 510b, 510c, and 510d are equally or unequally sized and shaped, as shown in FIGS. 5A and 5B, respectively. In the following examples, the conductive layers 510a, 510b, 510c, and 510d are equally sized for further illustration. However, the present invention can also be applied to the conductive layers which are unequally sized and shaped.

In addition to the conductive layers 510a, 510b, 510c, and 510d, the bonding pad structure 500 of the present invention further comprises a plurality of connecting portions connected to two adjoining conductive layers. The connecting portions are, for example, shaped as cylinders or layers.

Figure 5C:
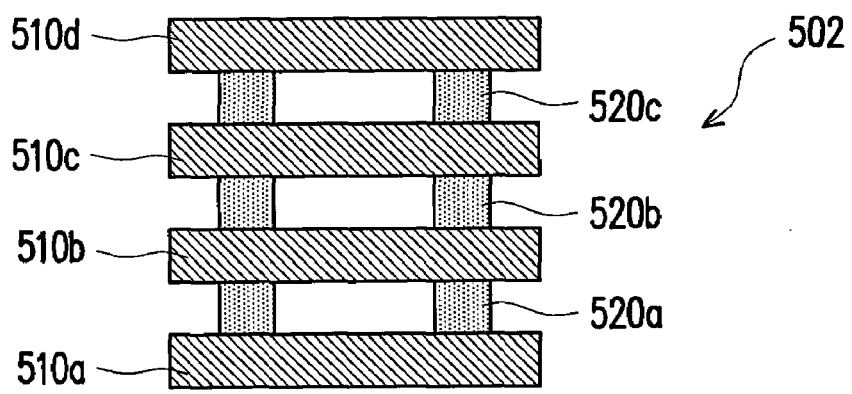
Figure 5D:
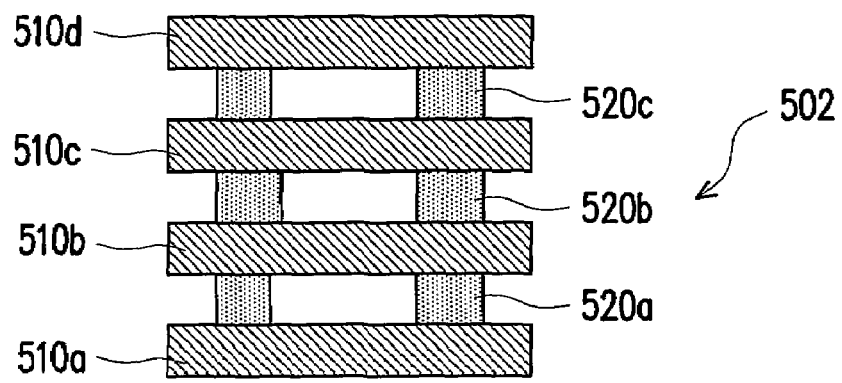
Figure 5E:
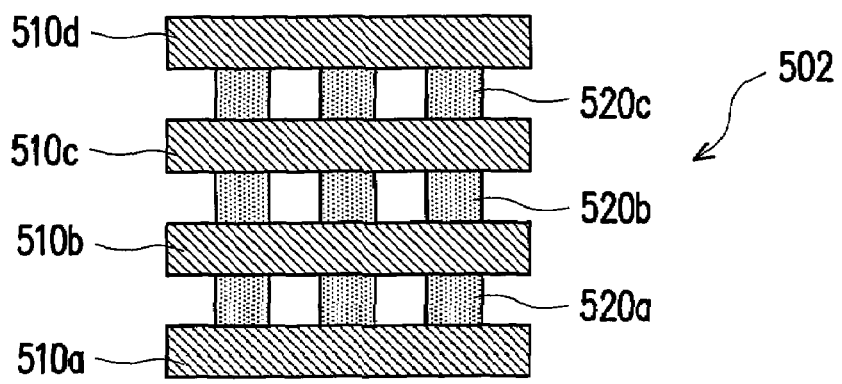
Figure 5F:
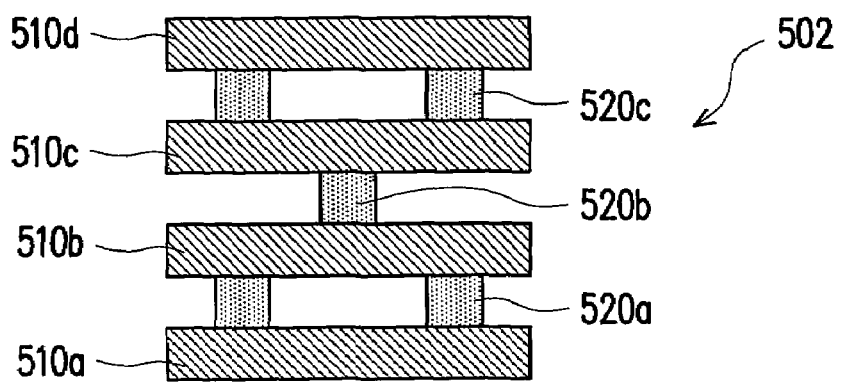
Figure 5G:
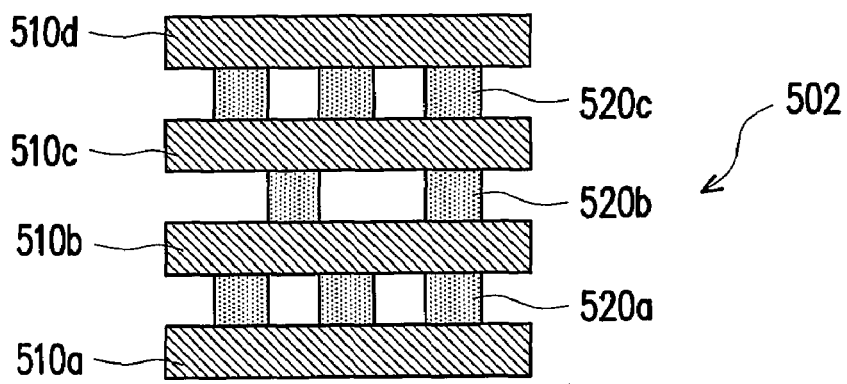

Referring to FIGS. 5C to 5G, the connecting portions 520a, 520b, and 520c of the bonding pad structure 502 disclosed in the embodiment of the present invention can be cylindrically shaped, which are similar to the vias of the interconnects. The connecting portions 520a, 520b, and 520c are arranged either in a regular way as shown in FIGS. 5C to 5F or in an irregular way as shown in FIG. 5G. In FIGS. 5C and 5D, the connecting portions 520a, 520b, and 520c are adapted to a line-up arrangement, while a matrix arrangement thereof is presented in FIG. 5E and an alternate arrangement alternate arrangement thereof is indicated in FIG. 5F. The connecting portions 520a, 520b , 520c are equally sized in FIG. 5C yet unequally sized in FIG. 5D. In FIG. 5D, the connecting portions 520c positioned in the same layer can be unequally sized and shaped, and the connecting portions 520b and 520c in different layers can also be unequally sized and shaped. It should be noted that the connecting portions 520a, 520b, 520c and the vias of the interconnects can be equally or unequally sized when the connecting portions 520a, 520b, and 520c are cylindrically shaped.

Figure 5H:
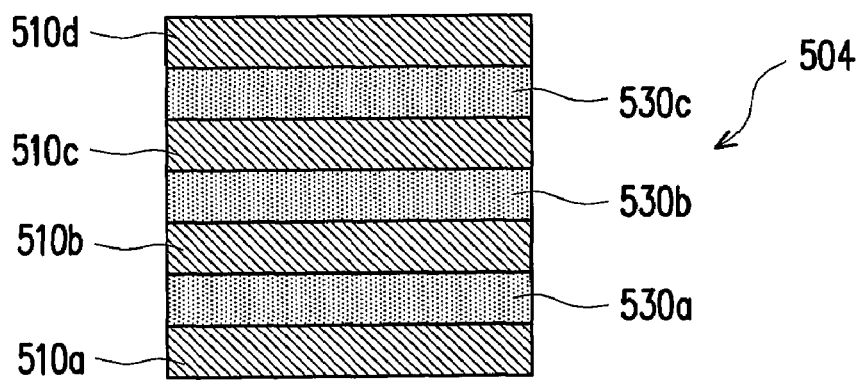
Figure 5I:
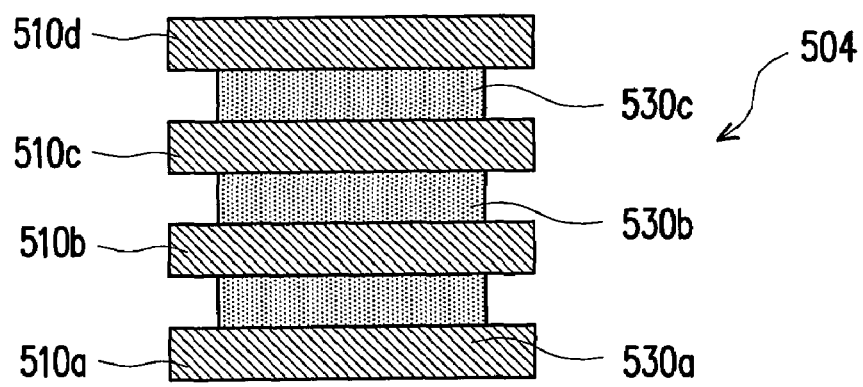
Figure 5J:
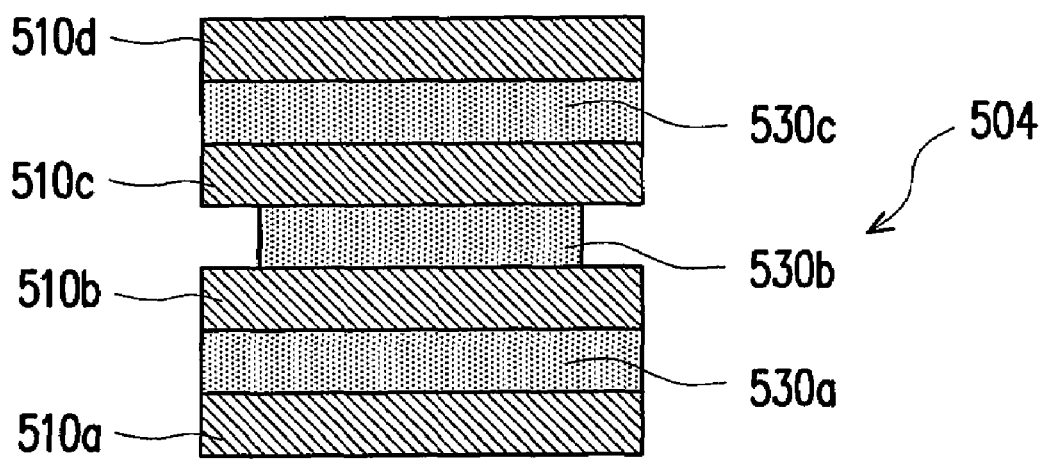

Referring to FIGS. 5H to 5J, the connecting portions 530a, 530b, and 530c of the bonding pad structure 504 described in the embodiment of the present invention can be shaped as layers. The connecting portions 530a, 530b, 530c and the conductive layers 510a, 510b, 510c, 510d can be either equally sized and shaped as shown in FIG. 5H, or be unequally sized and shaped as shown in FIG. 5I. Alternatively, a part of the connecting portions 530a, 530c and the conductive layers 510a, 510b, 510c, 510d are equally sized and shaped, while the other part of the terminal pad 530b and the conductive layers 510a, 510b, 510c, 510d are unequally sized and shaped, as indicated in FIG. 5J.

Figure 5K:
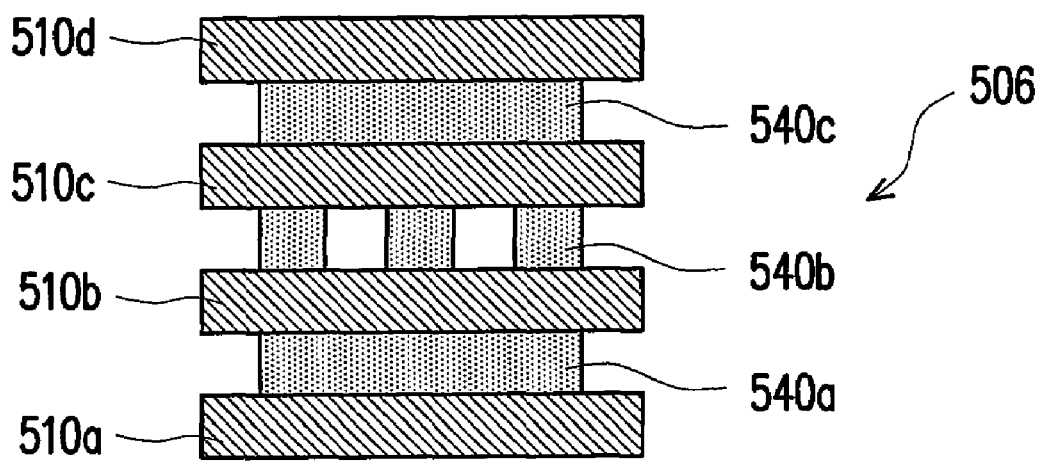

Referring to FIG. 5K, the connecting portions of the bonding pad structure 506 described in the embodiment of the present invention can be composed of a cylindrical part 540b and layers 540a, 540c.

In said bonding pad structure, the dielectric layer which is, for example, made of silicon oxide or low dielectric constant material, can be stuffed into the space between the conductive layers and the connecting portions.

The bonding pad structures of the present invention can be disposed not only at the sides of the chips but also on the front surfaces of the chips. Accordingly, when a packaging process is about to be performed on the chips, an edge-edge packaging method or an edge-front packaging method can be employed based on actual demands.

The bonding pad structures of the present invention are positioned at the sides of the chips, and metal wires can be linked to the bonding pads close to the sides of the chips when a metal wire routing process is performed. Thus, the length of the wires is decreased, the area occupied by the package structure is substantially reduced, and further miniaturization of the products can be permitted. On the other hand, the bonding pad structures are exposed during the cutting process. Hence, the bonding pads are unlikely to be corroded by a developer and form the pittings due to the formation of the bonding pad openings, as disclosed in the prior art. Furthermore, since the bonding pad openings are not formed through any additional process in the present invention, it is unlikely to make stains arisen from the formation of the bonding pad openings which gives rise to an uneven coating of a photoresist in a successive process, as disclosed in the prior art. Thus, optical characteristics can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing an integrated circuit chip, comprising the following steps:
   providing a substrate, wherein the substrate is divided into an internal region and an external region by a die seal ring region;
   forming a plurality of circuit units in the internal region on the substrate;
   forming a dielectric layer over the substrate, a plurality of interconnects in the dielectric layer within the internal region, and a plurality of first bonding pad structures in the dielectric layer within the external region, wherein each of the first bonding pad structures comprises at least a conductive layer and a vias/connecting portion; and
   performing a cutting process along a plurality of scribed lines on the substrate to form a plurality of chips, wherein the conductive layers and vias/connecting portions of the first bonding pad structures are exposed at the sides of each chip.

2. The method of claim 1, wherein the steps of forming the interconnects and the first bonding pad structures comprise:
   forming the plurality of conductive layers in the dielectric layer within the internal region and the external region;
   forming the plurality of vias/connecting portions electrically coupled with the conductive layers in the dielectric layer within the internal region and the external region, wherein parts of the conductive layers and the vias/connecting portions in the internal region constitute the interconnects, and
   parts of the conductive layers and the vias/connecting portions in the external region constitute the first bonding pad structures.

3. The method of claim 2, wherein the steps of forming the interconnects and the first bonding pad structures comprise:
   forming a first part of the dielectric layer on the substrate;
   forming the conductive layers on the first part of the dielectric layer;
   forming a second part of the dielectric layer over the substrate;
   forming a plurality of via openings/openings in the second part of the dielectric layer to expose parts of the conductive layers; and
   forming a plurality of conductive plugs in the via openings/openings so as to constitute the vias/connecting portions.

4. The method of claim 1, wherein the steps of forming the dielectric layer, the interconnects, and the first bonding pad structures comprise:

forming the dielectric layer on the substrate;
forming a plurality of trenches and a plurality of via openings/openings in the dielectric layer; and
filling a conductive material into the trenches and the via openings/openings to form the conductive layers and the vias/connecting portions.

5. The method of claim 1, wherein the first bonding pad structures extend from a edge of the die seal ring region to the scribed lines on the substrate.

6. The method of claim 1, further comprising the steps of forming a plurality of second bonding pad structures in the internal region before performing the cutting process along the scribe lines on the substrate.

* * * * *